US010575431B1

(12) United States Patent
Yang et al.

(10) Patent No.: US 10,575,431 B1
(45) Date of Patent: Feb. 25, 2020

(54) SUPPORTING AND POSITIONING STRUCTURES OF SERVER CHASSIS

(71) Applicant: Super Micro Computer Inc., San Jose, CA (US)

(72) Inventors: Chanchi Yang, San Jose, CA (US); Chaoching Wu, San Jose, CA (US)

(73) Assignee: SUPER MICRO COMPUTER INC, San Jose, CA (US)

( * ) Notice: Subject to any disclaimer, the term of this patent is extended or adjusted under 35 U.S.C. 154(b) by 0 days.

(21) Appl. No.: 16/132,346

(22) Filed: Sep. 14, 2018

(51) Int. Cl.
*H05K 7/18* (2006.01)
*A47B 88/497* (2017.01)

(52) U.S. Cl.
CPC ........... *H05K 7/183* (2013.01); *A47B 88/497* (2017.01)

(58) Field of Classification Search
CPC ............. H05K 7/1487; H05K 7/20736; H05K 7/20772; H05K 5/0217; H05K 7/1488; H05K 7/20818; H05K 7/14; H05K 7/183; H05K 5/02; H05K 5/03; H05K 7/18; H05K 1/184; H05K 5/023; H05K 7/1409; H05K 7/1427; H05K 9/0007; A47B 2210/0059; A47B 2088/4274; A47B 2088/4278; A47B 88/41; A47B 88/427; A47B 88/43; A47B 88/483; A47B 88/493; A47B 88/57
See application file for complete search history.

(56) References Cited

U.S. PATENT DOCUMENTS 10,244,868 B2 * 4/2019 Chen ...................... A47B 88/49

* cited by examiner

*Primary Examiner* — Jenny L Wagner
*Assistant Examiner* — Ingrid D Wright
(74) *Attorney, Agent, or Firm* — Chun-Ming Shih; HDLS IPR Services

(57) ABSTRACT

A supporting and positioning structure of server chassis including a metal plate combined with the chassis. A supporting body is combined at a lateral side of the mounting plate facing the server rack and includes a base and a pair of supporting plates. The base is fixed on the mounting plate, and the pair of supporting plates are arranged in parallel and at an interval so that a slot is formed therebetween. Moreover, a roller is rotatably disposed in the slot so that the chassis of the server rack can be supported and held.

9 Claims, 8 Drawing Sheets

SUPPORTING AND POSITIONING STRUCTURES OF SERVER CHASSIS

BACKGROUND OF THE INVENTION

Field of the Invention

The present invention generally relates to server chassis and, in particular to supporting and positioning structures of server chassis.

Description of Prior Art

Nowadays most server devices are provided by disposing a plurality of chassis in a cabinet in order to meet requirements of accessing large amount of electronic materials; besides, each chassis accommodates a motherboard, power supply modules, and a plurality of hard disks which are arranged in array.

Moreover, the chassis of the server device are connected to the cabinet through a slide rail to facilitate the extraction of hard disks by pushing and pulling the chassis. In addition, a plurality of positioning structures, such as hooks, are disposed between the chassis and the cabinet so that the chassis can be positioned through the hooks after being pushed into the cabinet. However, since the chassis has considerable weight after loading multiple hard disks, the positioning structures will be deformed or the gaps between the chassis will be changed due to the load when the chassis is positioned in the cabinet. In some cases, interference may be occurred between the upper chassis and the lower chassis.

In view of the above drawbacks, the Inventor proposes the present invention based on his expert knowledge and elaborate researches in order to solve the problems of prior art.

SUMMARY OF THE INVENTION

Accordingly, an object of the present invention is to provide supporting and positioning structures of server chassis to support chassis in the server rack so as to maintain the position of the chassis.

In order to achieve the object mentioned above, the present invention provides supporting and positioning structures of server chassis disposed in a chassis for supporting and positioning the chassis on a server rack. The structures comprise a mounting plate being a metal plate and combined on the chassis. A supporting body is combined at a lateral side of the mounting plate facing the server rack. The supporting body includes a base and a pair of supporting plates connected with the base, and the base is fixed on the mounting plate. The pair of supporting plates are arranged in parallel and at an interval so that a slot is formed between the pair of support plates. A roller is rotatably disposed in the slot.

Comparing to the prior art, the supporting and positioning structures of the present invention are disposed in a back of the handle of the chassis through the mounting plate. The structures include a supporting body combining at a lateral side of the mounting plate facing the server rack and a roller disposed in the supporting body. Thus, the supporting body can support the chassis of the server rack for maintaining the distance between the chassis to prevent interference occurred between the upper chassis and the lower chassis. Moreover, when the chassis is extracted from the server rack, the roller of the supporting and positioning structures will be rotated, and the supporting plate contacts the server rack by the curved surface so that friction between the supporting and positioning structures and the server rack will be reduced for extracting the chassis and to enhance the practice of the present invention.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
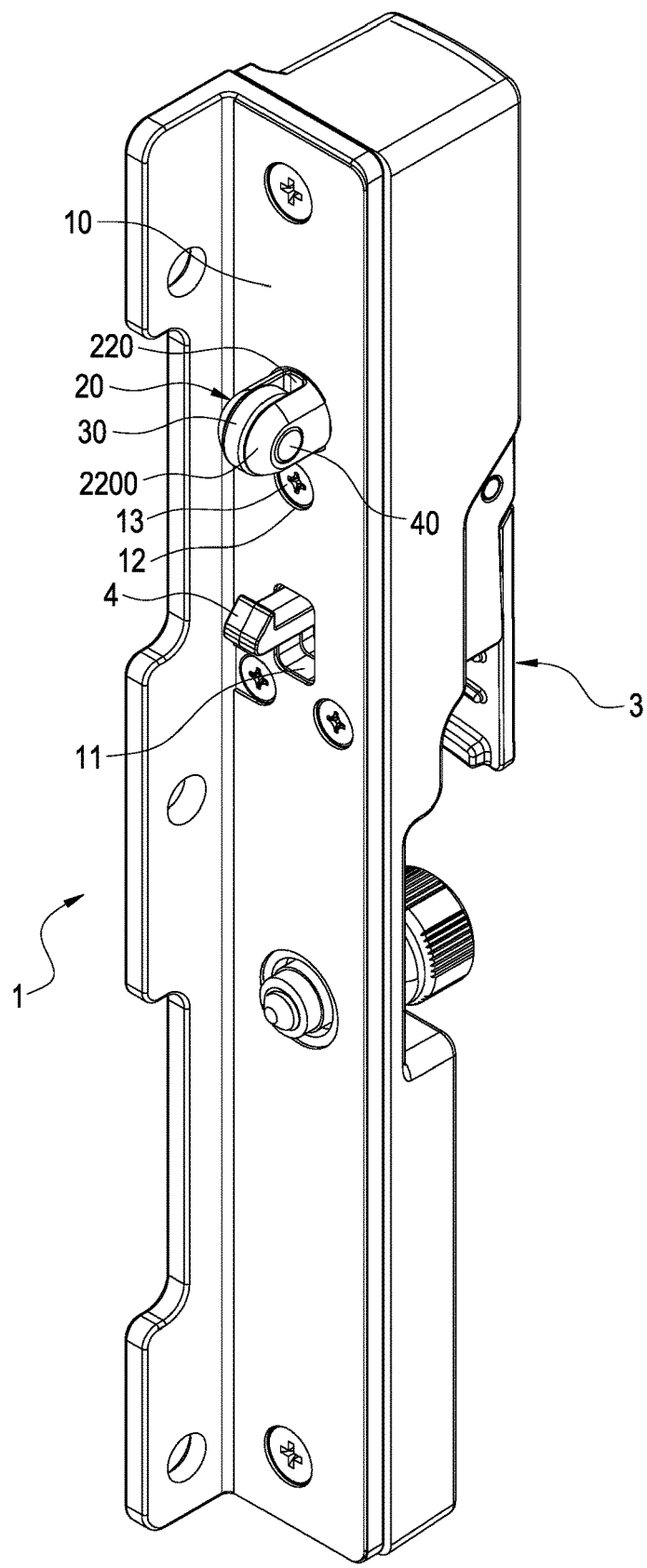
FIG. 1 is a perspective schematic view of the supporting and positioning structures combining with the handle of the present invention.
Figure 2:
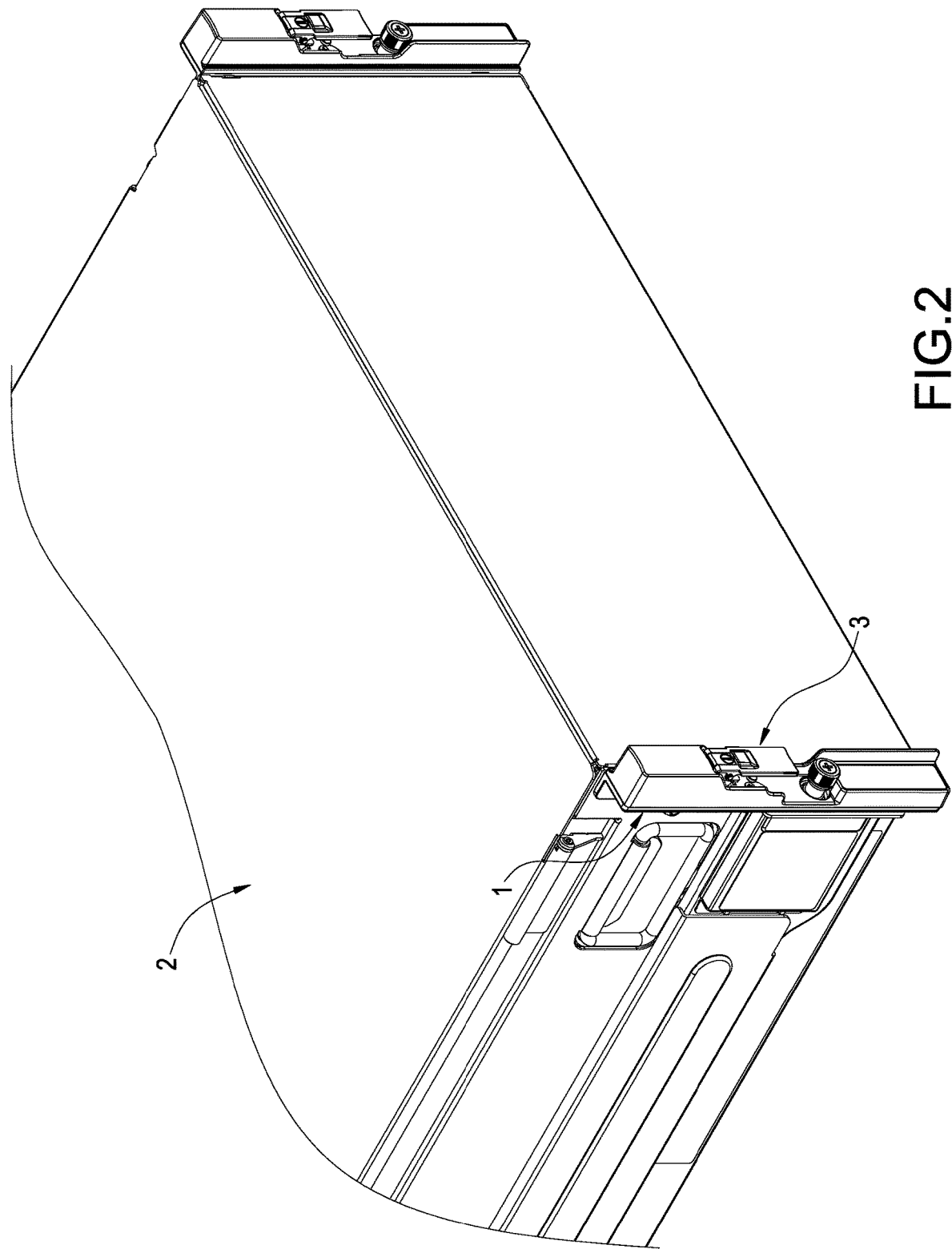
FIG. 2 and FIG. 3 are two perspective schematic views of the supporting and positioning structures after combining with the chassis of the present invention.
Figure 3:
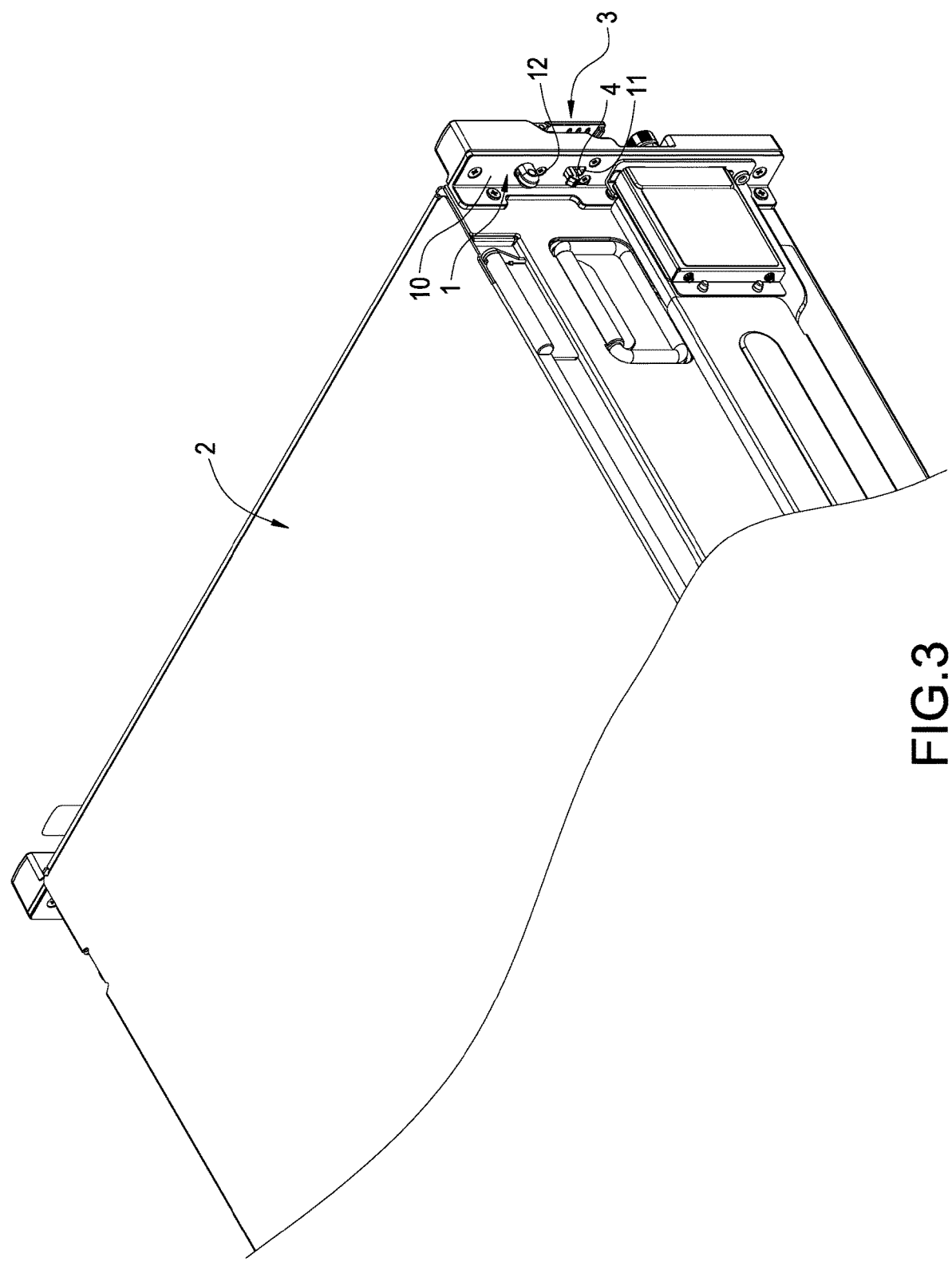

Please refer to FIG. 1 to FIG. 3, which depict a perspective schematic view of the supporting and positioning structures combining with the handle of the present invention and two perspective schematic views of the supporting and positioning structures after combining with the chassis of the present invention. The supporting and positioning structures 1 of server chassis are disposed in a chassis 2. The supporting and positioning structures 1 include a mounting plate 10, a supporting body 20 and a roller 30. The roller 30 is disposed on the supporting body 20. The supporting body 20 is fixed on the mounting plate 10, and the mounting plate 10 is combined with the chassis 2. Thereby, the supporting and positioning structures 1 are provided for supporting and positioning for the chassis 2. More detail descriptions of the supporting and positioning structures 1 are as follows.

In an embodiment of the present invention, the chassis 2 further includes a handle 3, and the mounting plate 10 is coupled to a back side of the handle 3. Besides, the handle 3 has a hook 4, and the mounting plate 10 has an opening 11 corresponding to the hook 4.

Figure 4:
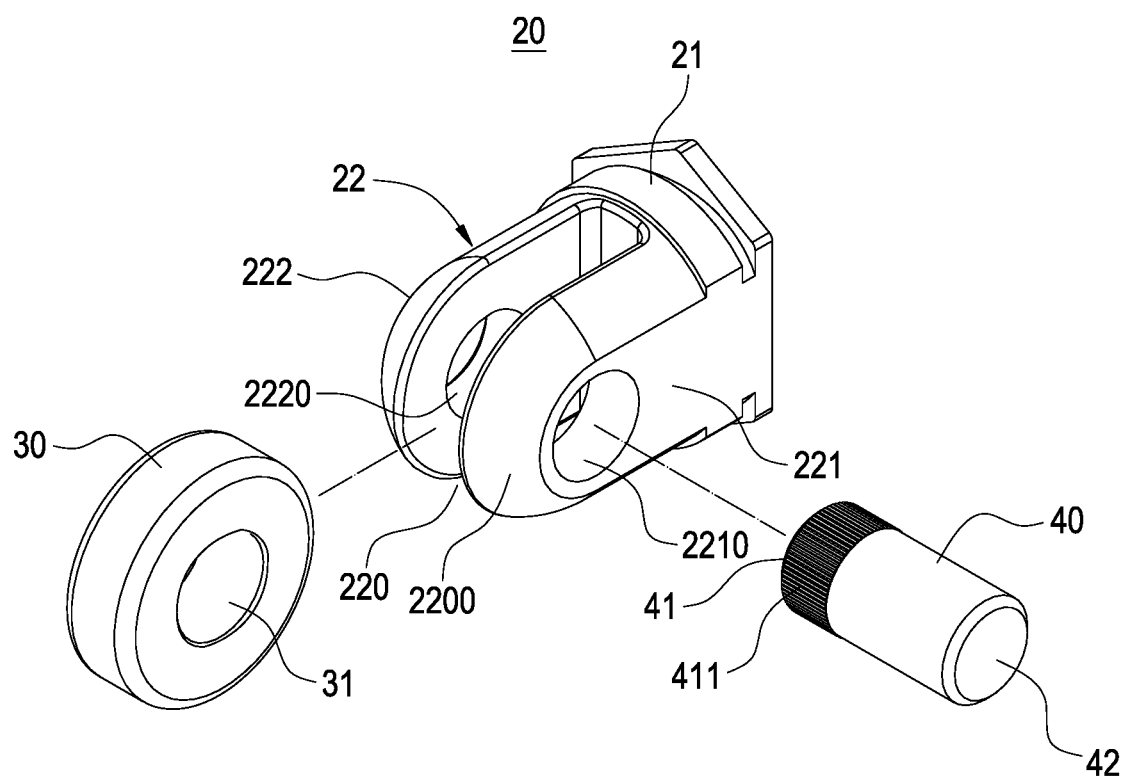
FIG. 4 is a perspective schematic view of the supporting and positioning structures of the present invention.
Figure 5:
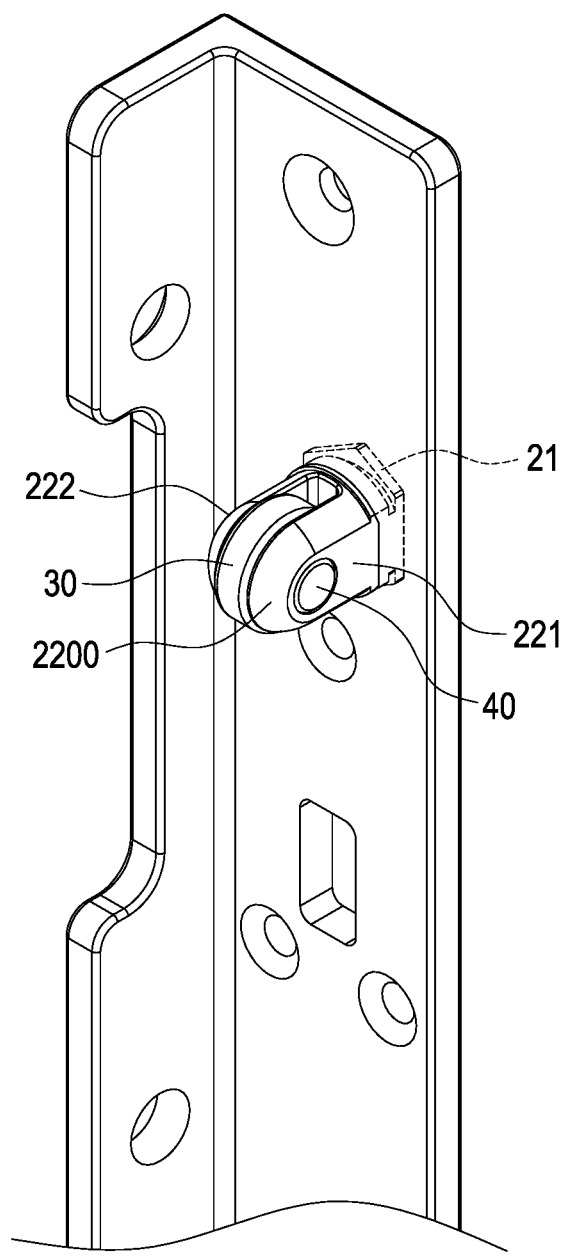
FIG. 5 is a partial perspective explosion schematic view of the supporting and positioning structures of the present invention.

Please also refer to FIG. 4 to FIG. 5, which depict a perspective schematic view and a partial perspective explosion schematic view of the supporting and positioning structures of the present invention. The mounting plate 10 is a metal plate and combined with the chassis 2. In the present embodiment, the mounting plate 10 is an L-shaped plate and has a plurality of locking holes 12. The mounting plate 10 is coupled to the chassis 2 through a plurality of locking components 13 (refer to FIG. 1) through the mounting plate 10.

The supporting body 20 is combined at a lateral side of the mounting plate 10, and the supporting body 20 includes a base 21 and a pair of supporting plates 22 connected with the base 21. The base 21 is fixed on the mounting plate 10. The pair of supporting plates 22 are arranged in parallel and at an interval so that a slot 220 is formed between the pair of support plates 22.

Preferably, the base 21 is riveted to the mounting plate 10. Besides, the pair of support plates 22 and the surfaces of the roller 30 are processed by heat treatment, thus the pair of support plates 22 and the roller have better hardness, wear resistance and corrosion resistance to enhance the strength of the supporting and positioning structures of server chassis. Moreover, the roller 30 is rotatably disposed in the slot 220.

In the present embodiment, the supporting and positioning structures 1 further includes a shaft 40. The pair of supporting plates 22 comprises a first supporting plate 221 having a first hole 2210 and a second supporting plate 222 having a second hole 2220. Furthermore, the roller 30 has a through hole 31, and the shaft 40 passes through the first hole 2210, the through hole 31 and the second hole 2220 for combing the roller 30 in the slot 220 of the supporting body 20.

Preferably, the shaft 40 has a first end 41 and a second end 42 located relatively, and a peripheral surface of the first end 41 is formed with a plurality of textures 411. In addition, an aperture of the first hole 2210 of the supporting plate 22 is larger than an aperture of the second hole 2220. Then the shaft 40 passes through the first hole 2210, the through hole 31 and the second hole 2220 sequentially by the first end 41 thereof. Besides, because the aperture of the first hole 2210 is larger than the aperture of the second hole 2220. Therefore, the first end 41 with the textures 411 can pass through the first hole 2210 and the through hole 31. At last, the first end 41 will get stuck in the second hole 2220 without moving, and the roller 30 will be held in the slot 220.

It is worthy of noticing that, in the present embodiment, a curved surface 2200 is formed on the periphery of each supporting plate 22 respectively. The pair of the supporting plates 22 contacts the server rack through the curved surfaces 2200 to reduce wear and maintain the integrity of the appearance for extending service life.

Figure 6:
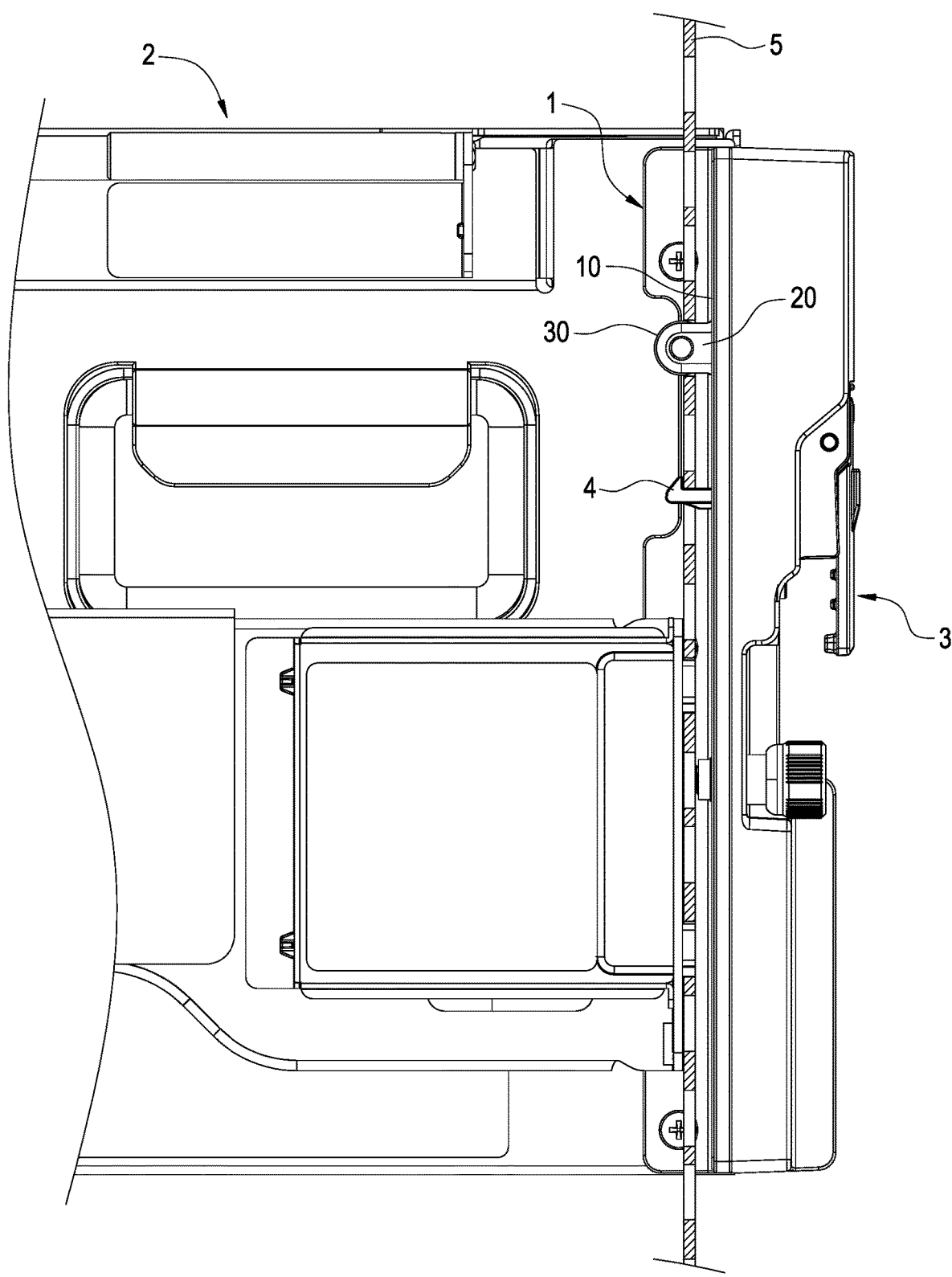
FIG. 6 is a cross sectional view of the supporting and positioning structures combining with the server rack of the present invention.
Figure 7:
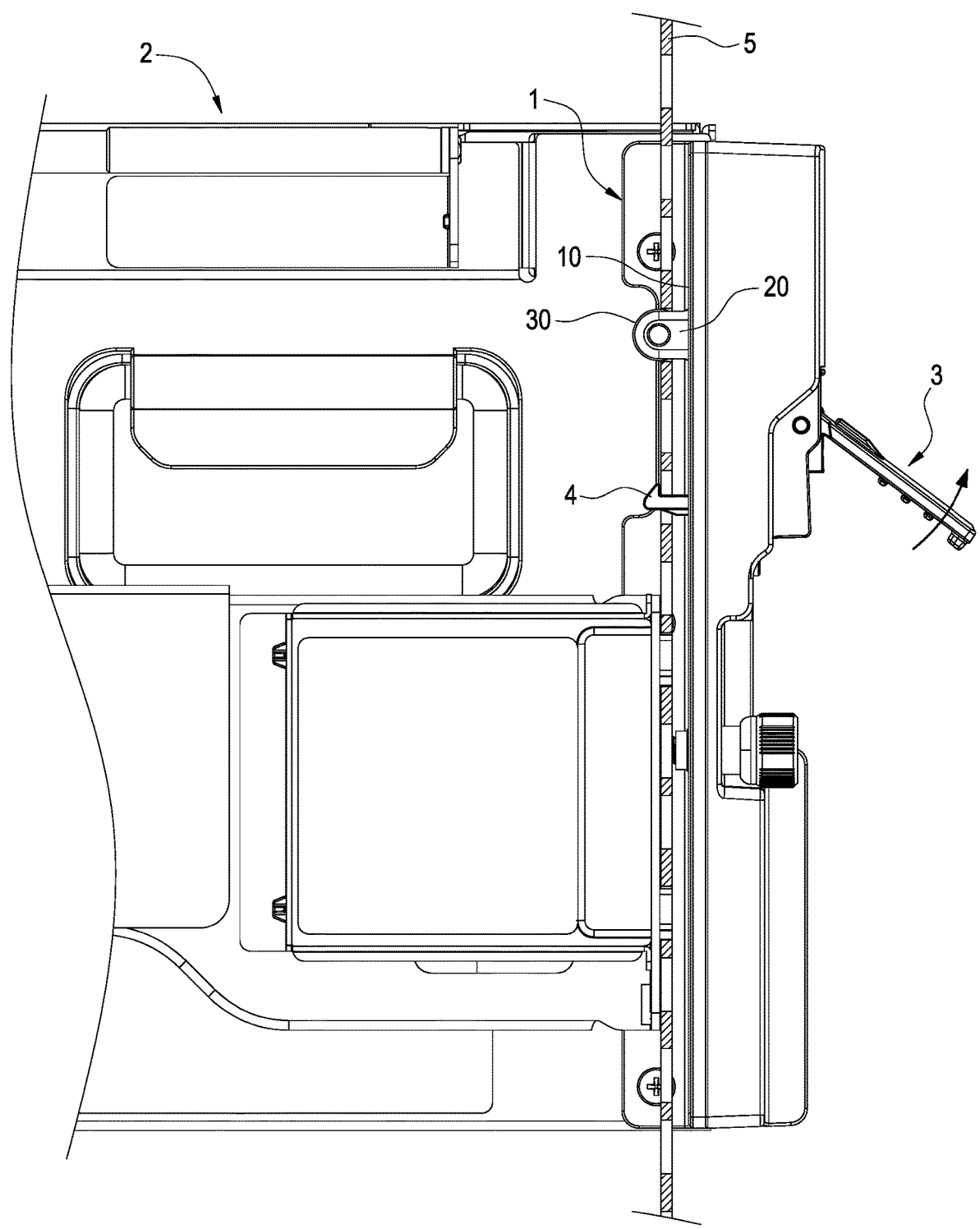
FIG. 7 is a schematic view of extracting chassis of the present invention.
Figure 8:
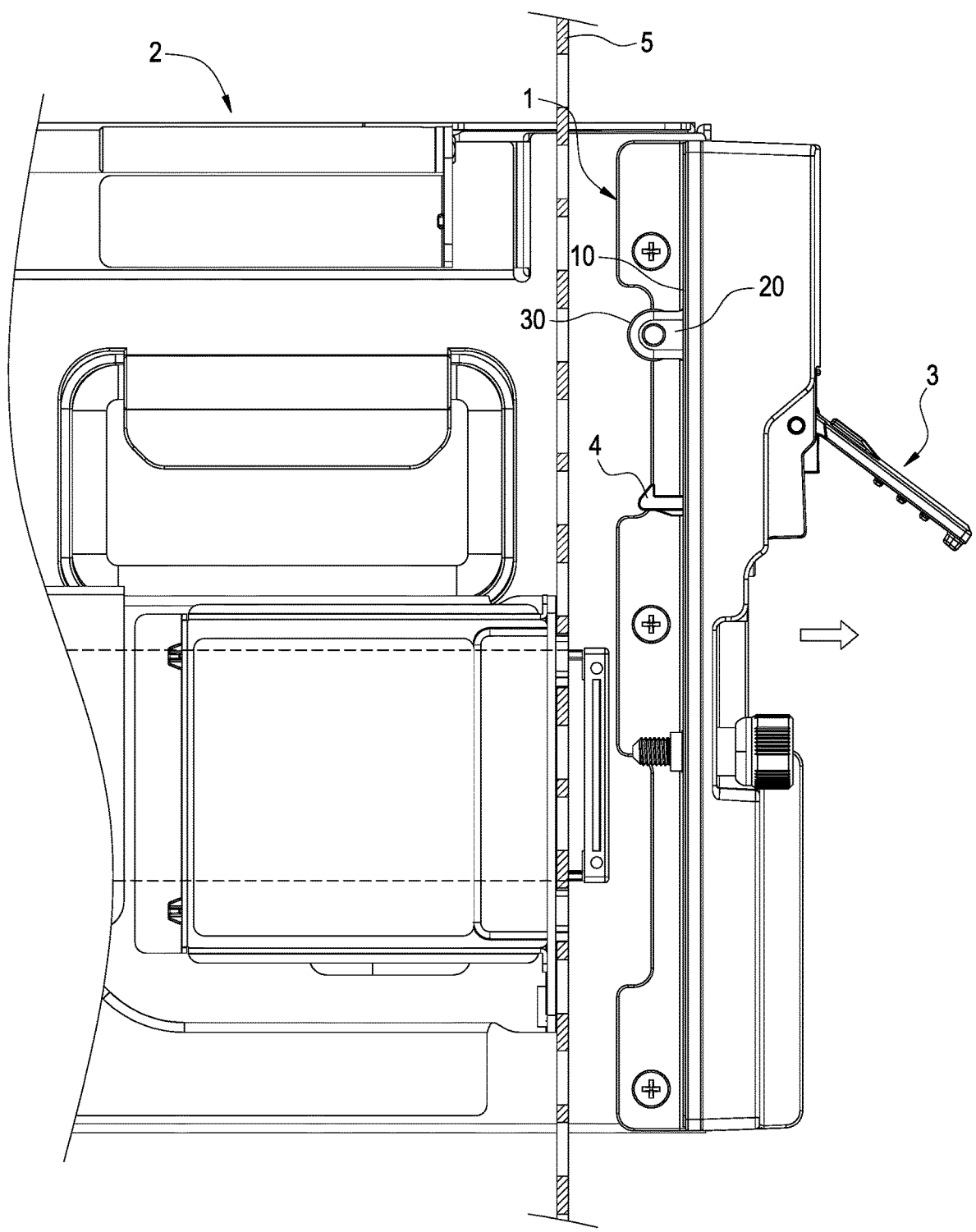
FIG. 8 is a cross sectional view of extracting chassis from the server rack of the present invention.

Please further refer to FIG. 6 to FIG. 8, which depict a cross sectional view of the supporting and positioning structures combining with the server rack, a schematic view of extracting chassis, and a cross sectional view of extracting the chassis from the server rack. As shown in FIG. 6, the supporting and positioning structures 1 of the present invention are disposed in the chassis 2 for supporting and positioning the chassis 2 on a server rack 5.

Specifically, the chassis 2 further includes a handle 3, and the handle 3 has a hook 4. Besides, the mounting plate 10 is coupled to a back side of the handle 3, and the supporting body 20 is combined at a lateral side of the mounting plate 10 facing the server rack 5. Moreover, the supporting body 20 and the hook 4 are inserted in holes of the server rack 5 respectively. Thereby, the chassis 2 can be positioned in the server rack 5 without moving. Hence the supporting body 20 and the hook 4 can support the weight of the chassis 2 together.

Moreover, please refer to FIG. 7, when users want to move the chassis 2 out of the server rack 5, the handle 3 needs to be raised firstly. Then the hook 4 is driven by the handle 3 to be disengaged from the server rack 5. Finally, as shown in FIG. 8, the chassis 2 can be extracted horizontally from the server rack 5 by exerting on the handle 3.

It is worthy of noticing that, when the chassis 2 is moved from the server rack 5, the roller 30 of the supporting the positioning structures 1 will be rotated. Moreover, since the pair of support plates contact the server rack 5 by the curved surface 2200, the friction between the supporting and positioning structures 1 and the server rack 5 can be reduced so that the chassis 2 can be extracted from the server rack 5 without excessive wear.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. Supporting and positioning structures of server chassis disposed in a chassis for supporting and positioning the chassis on a server rack, comprising:
   a mounting plate being a metal plate and combined with the chassis;
   a supporting body combined at a lateral side of the mounting plate facing the server rack; the supporting body including a base and a pair of supporting plates connected with the base; the base fixed on the mounting plate, and the pair of supporting plates being arranged in parallel and at an interval so that a slot is formed between the pair of supporting plates; and
   a roller rotatably disposed in the slot,
   wherein the mounting plate has a plurality of locking holes, and the mounting plate is coupled to the chassis through a plurality of locking components inserted in the mounting plate.

2. The supporting and positioning structures of server chassis according to claim 1, wherein the chassis further includes a handle, and the mounting plate is coupled to a back side of the handle.

3. The supporting and positioning structures of server chassis according to claim 2, wherein the handle has a hook; the mounting plate has an opening corresponding to the hook, and the hook is inserted through the opening and disposed on the server rack.

4. Supporting and positioning structures of server chassis disposed in a chassis for supporting and positioning the chassis on a server rack, comprising:
   a mounting plate being a metal plate and combined with the chassis;
   a supporting body combined at a lateral side of the mounting plate facing the server rack; the supporting body including a base and a pair of supporting plates connected with the base; the base fixed on the mounting plate, and the pair of supporting plates being arranged in parallel and at an interval so that a slot is formed between the pair of supporting plates;
   a roller rotatably disposed in the slot; and
   a shaft, wherein the pair of supporting plates includes a first supporting plate having a first hole and a second supporting plate having a second hole; the roller has a through hole, and the shaft passes through the first hole, the through hole and the second hole sequentially for combing the roller in the slot of the supporting body.

5. The supporting and positioning structures of server chassis according to claim 4, wherein the shaft has a first end and a corresponding second end, and a peripheral surface of the first end is formed with a plurality of textures.

6. The supporting and positioning structures of server chassis according to claim 5, wherein an aperture of the first hole is larger than an aperture of the second hole.

7. Supporting and positioning structures of server chassis disposed in a chassis for supporting and positioning the chassis on a server rack, comprising:
   a mounting plate being a metal plate and combined with the chassis;
   a supporting body combined at a lateral side of the mounting plate facing the server rack; the supporting body including a base and a pair of supporting plates connected with the base; the base fixed on the mounting plate, and the pair of supporting plates being arranged in parallel and at an interval so that a slot is formed between the pair of supporting plates; and
   a roller rotatably disposed in the slot,
   wherein a curved surface is formed on a periphery of each of the pair of supporting plates, and the pair of supporting plates contact the server rack by the curved surface.

8. Supporting and positioning structures of server chassis disposed in a chassis for supporting and positioning the chassis on a server rack, comprising:
   a mounting plate being a metal plate and combined with the chassis;
   a supporting body combined at a lateral side of the mounting plate facing the server rack; the supporting body including a base and a pair of supporting plates connected with the base; the base fixed on the mounting plate, and the pair of supporting plates being arranged in parallel and at an interval so that a slot is formed between the pair of supporting plates; and
   a roller rotatably disposed in the slot,
   wherein the base is riveted to the mounting plate.

9. Supporting and positioning structures of server chassis disposed in a chassis for supporting and positioning the chassis on a server rack, comprising:
   a mounting plate being a metal plate and combined with the chassis;
   a supporting body combined at a lateral side of the mounting plate facing the server rack; the supporting body including a base and a pair of supporting plates connected with the base; the base fixed on the mounting plate, and the pair of supporting plates being arranged in parallel and at an interval so that a slot is formed between the pair of supporting plates; and
   a roller rotatably disposed in the slot,
   wherein the pair of supporting plates and surfaces of the roller are processed by heat treatment.

* * * * *